United States Patent [19]

Kinney et al.

[11] Patent Number: 4,532,700

[45] Date of Patent: Aug. 6, 1985

[54] METHOD OF MANUFACTURING SEMICONDUCTOR STRUCTURES HAVING AN OXIDIZED POROUS SILICON ISOLATION LAYER

[75] Inventors: Wayne I. Kinney, Albuquerque, N. Mex.; Jerome B. Lasky, Essex Junction; Larry A. Nesbit, Williston, both of Vt.

[73] Assignee: International Business Machines Corp., Armonk, N.Y.

[21] Appl. No.: 604,563

[22] Filed: Apr. 27, 1984

[51] Int. Cl.³ .................... H01L 21/20; H01L 21/76
[52] U.S. Cl. ............................ 29/576 W; 29/576 E; 29/577 C; 29/578; 148/1.5; 148/175; 148/DIG. 37; 148/DIG. 51; 148/DIG. 85; 148/DIG. 86; 148/DIG. 117; 156/628; 204/15; 204/34.5; 204/129.1; 204/129.3; 357/49; 357/50
[58] Field of Search ............. 29/576 E, 576 W, 577 C, 29/578; 148/1.5, 175; 156/628; 204/32 S, 15, 129.1, 129.3; 357/49, 50

[56] References Cited

U.S. PATENT DOCUMENTS

| | | | |
|---|---|---|---|
| 3,640,806 | 2/1972 | Watanabe et al. | 204/143 |
| 3,919,060 | 11/1975 | Pogge et al. | 204/129.3 |
| 4,016,017 | 4/1977 | Aboaf et al. | 148/187 |
| 4,104,090 | 8/1978 | Pogge | 148/175 |
| 4,369,561 | 1/1983 | Tonnel | 148/175 X |
| 4,380,865 | 4/1983 | Frye et al. | 29/576 W |

OTHER PUBLICATIONS

"Full Isolation Technology by Porous Oxidized Silicon and Its Application to LSI's", K. Imai et al., IEDM 81, pp. 376–379.

"A New Dielectric Isolation Method Using Porous Silicon", Solid State Elec., vol. 24, pp. 159–164, 1981.

"Formation and Properties of Porous Silicon and Its Application", J. Electrochem. Soc., pp. 1351–1355, Oct. 1975, Solid-State Science and Technology.

*Primary Examiner*—William G. Saba
*Attorney, Agent, or Firm*—Mark F. Chadurjian; George Tacticos

[57] ABSTRACT

A method is provided for manufacturing semiconductor structures having dielectrically isolated silicon regions on one side of a silicon body. This is accomplished by forming in the silicon body a set of buried regions and a set of surface regions having characteristics which make them anodically etch slower than the remaining portion of the silicon body. These two sets of regions define portions in the silicon body which are anodically etched to form porous silicon regions which are oxidized to form an isolation structure that isolates the silicon surface regions from each other and the remaining portion of the silicon body. Typically in a P-type silicon body the buried and surface regions are N-type regions formed through ion implantation. Using these N-type regions to control the exposure of the P-type material to the anodic etching solution and the formation of the porous silicon regions, a structure is obtained wherein surface monocrystalline silicon regions are isolated from the rest of the silicon body by a uniform layer of silicon dioxide having a predetermined thickness.

15 Claims, 7 Drawing Figures

METHOD OF MANUFACTURING SEMICONDUCTOR STRUCTURES HAVING AN OXIDIZED POROUS SILICON ISOLATION LAYER

DESCRIPTION

TECHNICAL FIELD

This invention relates to a method of manufacturing semiconductor structures. More particularly, it relates to a method for manufacturing semiconductor structures having an oxidized porous silicon isolation layer to electrically isolate regions of silicon.

BACKGROUND OF THE INVENTION

It is often necessary for devices constructed in the same substrate to be electrically isolated from each other. Various structures have been used to provide such an isolation. For example, different dielectric materials have been formed in semiconductor substrates about active and passive elements that need to be isolated and there have been several methods for forming dielectric materials for such applications. Some of these methods involve the oxidation of porous silicon layers to form isolation regions. Method for using such an approach have been disclosed in U.S. Pat. No. 3,640,806 issued on Feb. 8, 1972 to Y. Watanabe et al, U.S. Pat. No. 3,919,060 issued on Nov. 11, 1975 to H. B. Pogge et al, U.S. Pat. No. 4,016,017 issued on Apr. 5, 1977 to J. A. Aboaf et al and U.S. Pat. No. 4,104,090 issued on Aug. 1, 1978 to H. B. Pogge, the later three of which are assigned to the assignee of the present application. The Watenabe et al patent discloses a process which in general consists of masking a silicon substrate, anodizing the substrate to form porous silicon regions in the unmasked areas and exposing the heated substrate to an oxidizing ambient. The porous silicon oxidizes at a rapid rate to form an insulator around monocrystalline silicon regions. The Pogge et al patent describes a method for producing dielectrically isolated regions in a silicon substrate by forming in the substrate high conductivity regions of an opposite conductivity type to that of the substrate to define the areas where dielectric regions are needed. These regions are then anodically etched using a hydrofluoric acid solution to produce regions of porous silicon in the high conductivity regions. These porous silicon regions are then exposed to an oxidizing ambient at an elevated temperature to oxidize the porous silicon regions to form a complete isolation of the monocrystalline silicon regions.

The Aboaf et al patent describes a process for making in a semiconductor structure a pattern of oxidized and densified porous silicon regions for dense isolation. The process involves forming a pattern of porous silicon regions in the surface of a silicon substrate and oxidizing the structure at a temperature sufficient to completely oxidize the porous silicon. The oxidation is selected so that the oxidized porous silicon extends above the surface of the silicon body. The oxidized porous silicon regions are then subjected to a temperature higher than the oxidizing temperature utilized in the previous step to cause the oxidation of the porous silicon.

The Pogge patent discloses a process which includes forming on a P type substrate a P+ layer and in this P+ layer an N or P type surface layer and forming openings in the N or P surface layer which reach at least down to the P+ layer. The structure is then subjected to anodic etching techniques which preferentially attack the P+ layer to form porous silicon throughout the P+ layer. The structure is then placed in a thermal oxidation ambient until the porous silicon layer has been fully oxidized to silicon dioxide. The openings through the surface layer are then filled up with oxide to fully isolate the N or P surface layer.

The inventions disclosed and claimed in the aforementioned patents represent truly significant advances in this art as explained in said patents. Our present invention extends the developments in this area of technology and has many advantages and flexibilities. For example, it produces structures having a buried oxidized porous silicon layer which is substantially uniform in thickness and can be made relatively thin and with improved uniformity of silicon porosity under the preselected Si islands.

THE INVENTION

The general purpose of this invention is to provide a method of manufacturing semiconductor structures having oxidized porous silicon isolation layers. In accordance with the present invention, a method is provided for forming new and improved semiconductor structures having monocrystalline silicon regions isolated from each other by an oxidized porous silicon layer. It involves providing a silicon body of a predetermined conductivity and forming in it a set of buried regions which under predetermined anodic etching conditions etch slower than the silicon material surrounding them. A set of surface regions are also formed so that under these same anodic etching conditions these regions will anodize slower than their surrounding silicon material. These surface regions are formed so that they overlap the spaces between adjacent buried regions and to partially overlap the underlying buried regions. The two sets of regions define a silicon layer between them which can be anodized faster than the aforementioned regions which define it. The structure is then anodically etched to selectively convert the silicon between the surface regions and between the buried regions and the portion between the two sets of regions into porous silicon. This porous silicon is then converted into silicon dioxide by oxidation. The resulting structure comprises of monocrystalline silicon regions which are isolated from each other and from the remaining silicon body by a layer of silicon dioxide. By preselecting the relative position of the surface and buried regions the position and size of the silicon dioxide layer is defined. Thus, the silicon dioxide layer which is the isolation layer of the structure can be made to be of a uniform thickness and as thin as needed.

In a preferred embodiment of this invention using a P type silicon body the buried regions and surface regions are regions of N type conductivity formed through ion implantation. The silicon portion between the set of buried regions and the set of surface regions is preselected so that after it is anodized and oxidized it produces the desired thickness for the oxidized porous silicon layer. This silicon portion is also made heavily doped through ion implantation to convert it into a P+ type material to enhance its preferential etching characteristics relative to the rest of the P type silicon portions and even more so relative to the anodic etching characteristics of the N type regions. Following the oxidation of the porous silicon layer, the structure can be annealed to densify the oxidized porous silicon layer.

DETAILED DESCRIPTION

Figure 1:
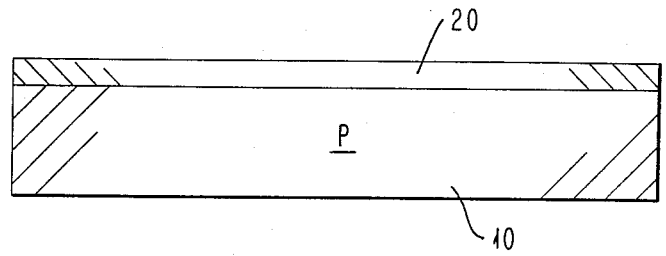
FIGS. 1 through 6 illustrate, in a series of diagrammatic cross sectional views, a sequence of some of the most important process steps utilized in making a structure having an oxidized porous silicon isolation layer in accordance with the teachings of the present invention.
Figure 2:
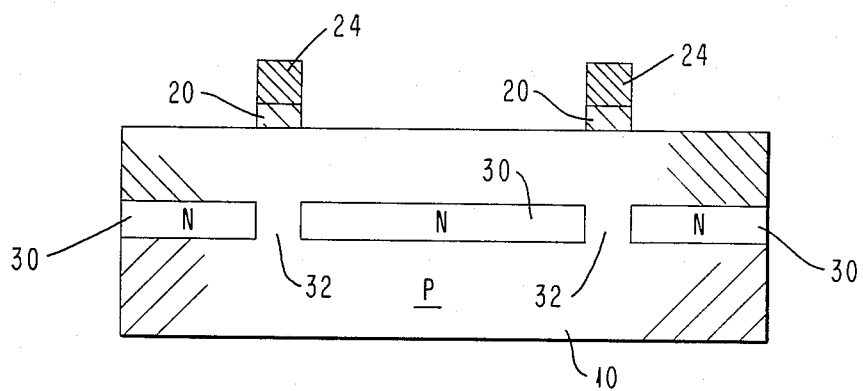
Figure 3:
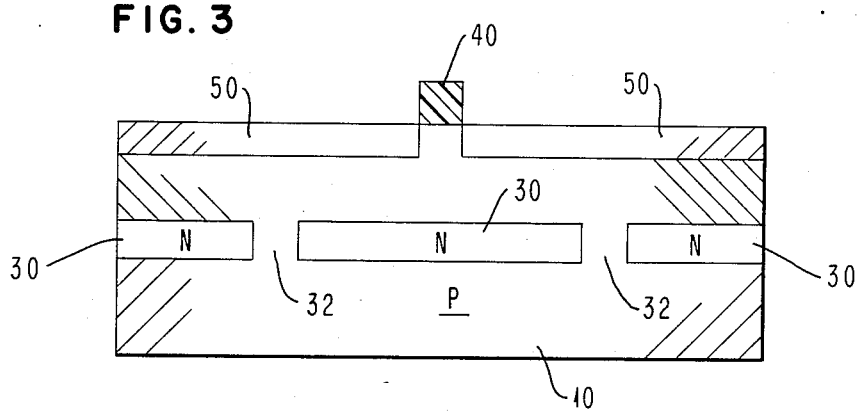
Figure 4:
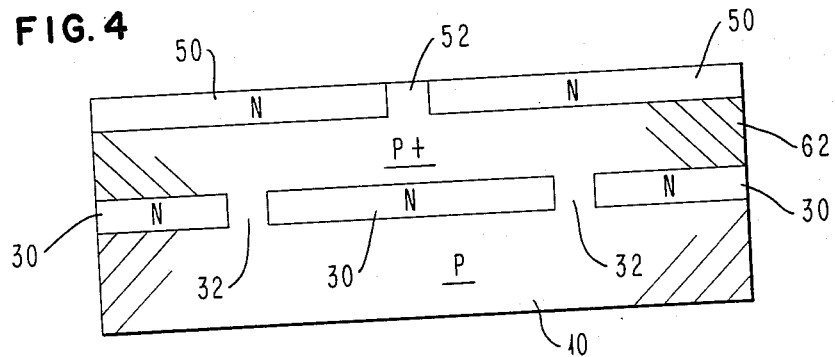

Referring now to FIG. 1, there is shown a silicon body 10, which may have a P type or P− type conductivity having a P type dopant concentration of $10^{16}$ atoms/cm$^3$, on which a silicon dioxide layer 20 is formed. The silicon dioxide layer may be thermally grown or deposited and should preferably be in the range between 250 and 450 Å. On the silicon dioxide layer 20 a masking layer, such as for example aluminum, is deposited and patterned through conventional masking techniques to define the relative lateral position of the buried regions and their distance from each other. In FIG. 2 there is shown patterned aluminum layer 24 which is used to etch the exposed portions of silicon dioxide layer 20. Ion implantation is then used to implant N type ions (i.e. phosphorus) into silicon body 10 using the aluminum layer 24 as an ion implantation mask to form the N type buried regions 30. The aluminum mask 24 is then removed through a conventional aluminum etching step. Using the patterned silicon dioxide layer 20 as a mask alignment aid, a photoresist mask 40 is formed, as shown in FIG. 3, to define the position and size of the surface regions 50. The patterned silicon dioxide layer 20 is then removed and using the photoresist mask 40 as an ion implantation mask N type surface regions 50 are formed. The photoresist mask 40 is then formed using conventional photoresist etching techniques. The surface regions 50 are formed so that the P type regions 52 between adjacent N type regions are centered to be over and close to the centers of the buried regions. Similarly, the P type regions 32 between adjacent buried regions 30 are typically centered under the surface regions 50. The set of N type surface regions 50 and the set of N type buried regions 30 define the positions of P type regions 32 and 52 and P type region 62 between the two sets of N type regions as shown in FIG. 4. Regions 52, 62 and 32 may become P+ through an ion implantation step which can implant P type ions (i.e. boron) with an implantation distribution peeking typical at $10^{19}$ atoms/cm$^3$ somewhere between the two sets of N regions which is typically at a depth of 1 μm into the silicon body. This will enhance the preferential anodic etching characteristics of regions 32, 52 and 62 over those of N regions 30 and 50 and the P material of the remaining portion of silicon body 10. The structure is then annealed to activate the implanted ions. If regions 30 and 50 are formed through the implantations of N type ions from a Group V element of the Periodic Table and regions 32, 52 and 62 are made through the implantation of P type ions from a Group III element of the Periodic Table then this annealing step should take place at about 950° C. for about 30 minutes.

Figure 5:
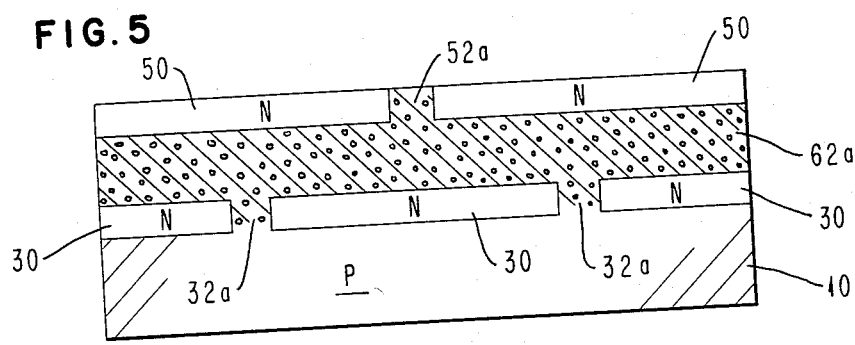
Figure 6:
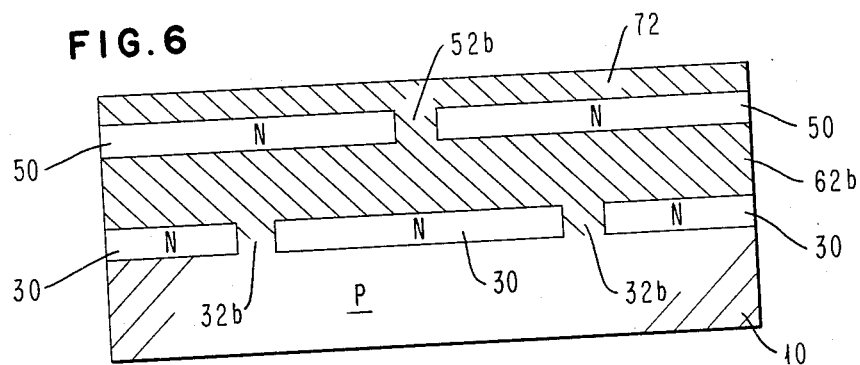

The P+ type regions 32, 62 and 52 are anodically etched in a solution which converts the silicon in these regions into porous silicon regions 32a, 62a and 52a as shown in FIG. 5. This can be done using a conventional procedure such as that described in U.S. Pat. No. 3,919,060 referred to in the Background Section of this application. Basically, this procedure involves anodizing the structure in an aqueous HF solution at a current density sufficient to achieve porosity (i.e. 2 to 100 ma/cm$^2$). In general the anodizing solution should contain HF in a preferred range of 12 to 50 percent. The specific concentration of HF in any particular solution will depend on the device configuration, dopant concentration, solution temperature, current density, illumination, etc. The silicon body is made the anode while a suitable plate in the solution acts as the cathode. The selected porosity for the silicon can be in the range of 50 to 80 percent. By varying the HF concentration in the anodizing solution, the illumination, the temperature of the solution and the doping concentration of the silicon to be converted, the porosity can vary. In the structure of FIG. 5, anodization starts through regions 52a, then it laterally spreads through layer 62a and finally down to regions 32a. The anodic etching is thus confined by the N type regions to the silicon portion between them. The structure is then oxidized by being exposed to an oxidizing ambient of about 700° to 1000° C. The porous silicon regions, which oxidize much faster that the rest of the silicon body, will convert into silicon dioxide (52b, 62b and 32b) as shown in FIG. 6. At the same time an SiO$_2$ layer 72 is also formed at the surface of the structure. The structure may also be annealed at a temperature higher than the oxidizing temperature used to oxidize the porous silicon so that the porous silicon dioxide regions can densify as discussed in U.S. Pat. No. 4,016,017 referred to above. The resulted characteristics of the densified silicon dioxide depend on the annealing time, temperature and porosity of the original porous silicon regions. Such a step can take place in a nitrogen or other suitable inert enviroment or in an oxidizing ambient. U.S. Pat. No. 4,016,017 discusses different combinations of these parameters. For example, temperatures over about 1150° C. for about 2 hours would be enough to sufficiently densify a porous silicon dioxide. Silicon dioxide layer 72 can be removed and devices can be held in the N type monocrystalline silicon regions 50 which are isolated from each other and the main silicon body by silicon dioxide material.

In one variation of this method the buried and surface regions 30 and 50 respectively of the structure are formed through the implantation of hydrogen ions (protons) into preselected portions of the silicon body. Implanted protons produce donors in silicon as described in an article by Kazuo Imai and Shigeru Nakajima entitled "Full Isolation Technology by Porous Oxidized Silicon and its application to LSIs", published in IEDM 81, pages 376-379. Regions implanted with protons behave like regions of N-type conductivity in a anodizing environment. If protons are used to make the buried and surface regions then the structure must be heated to a relatively low temperature to activate the ions. For example the structure should be exposed to 400° to 500° C. for about 30 minutes.

Figure 7:
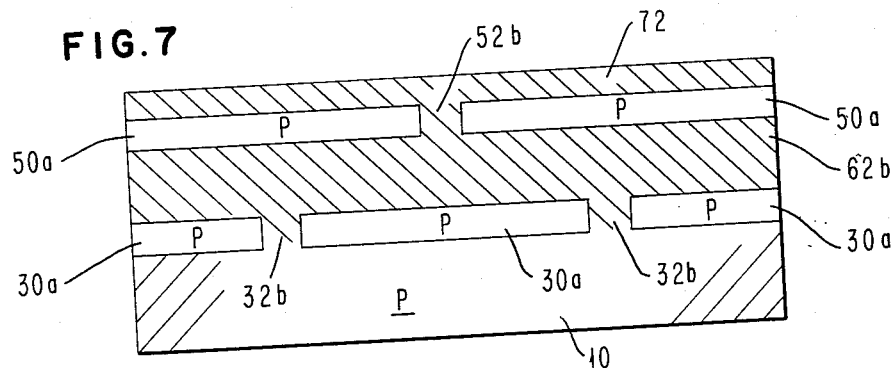
FIG. 7 illustrates an alternative embodiment of the present invention.

Furthermore, if the portion between the two sets of N-regions and between adjacent N-regions are to be made P+, then a predetermined portion of the silicon body should be made P+ prior to the formation of the buried regions 30 and surface regions 50. Then the structure must be annealed at a temperature between 700° and 1000° C. to activate the P-type ions, followed by maskings and hydrogen ion implantations for the formation of the buried and surface regions. After the porous silicon regions are formed and oxidized then the structure can be heated to about 700° C. for about 30 minutes to cause the protons in the buried and surface regions to diffuse away. This causes these two sets of regions to revert back to their previous conductivity type, prior to the proton inplantation, which in this example was P type. The resulting structure will then have dielectrically isolated monocrystalline silicon regions 30a and 50a having a P type conductivity as shown in FIG. 7.

While the invention has been described in connection with preferred embodiments, it will be understood that the invention is not limited to those particular embodiments described in the specification and depicted in the drawings. On the contrary, it is intended to cover all alternatives, modifications and equivalents, as may be included within the spirit and scope of the invention as defined in the appended claims.

What is claimed is:

1. A method of forming a semiconductor structure having dielectrically isolated monocrystalline silicon regions comprising:
   (a) providing a silicon body of a predetermined conductivity;
   (b) forming in said silicon body a set of buried regions which under predetermined anodizing conditions etch slower than the silicon regions adjacent them;
   (c) forming a set of surface regions which under said anodizing conditions etch slower than the silicon regions around them wherein said surface regions overlie said regions between adjacent buried regions and partially overlie said adjacent buried regions and wherein said buried regions and said surface regions define a portion in said silicon body which etches faster than said buried and surface regions under said predetermined anodizing conditions;
   (d) anodically etching said silicon body to selectively convert said silicon regions between buried regions and surface regions and said silicon portion between said two sets of regions into porous silicon material;
   (e) subjecting said silicon body to oxidation to convert said porous silicon material into silicon dioxide.

2. A method as set forth in claim 1 wherein:
   (a) said silicon body has a P type conductivity;
   (b) said buried regions are formed through the implantation into predetermined regions of said silicon body of N type conductivity determining ions; and
   (c) said surface regions are formed through the implantation into predetermined regions of said silicon body of N type conductivity determining ions.

3. A method as set forth in claim 2 which further includes the step of implanting into said silicon portion between said two sets of regions P type conductivity determining ions prior to said anodically etching step.

4. A method as set forth in claim 1 wherein:
   (a) said silicon body has a P type conductivity;
   (b) said buried regions are formed by implanting protons into predetermined regions of said silicon body;
   (c) said surface regions are formed by implanting N type conductivity determining ions into predetermined regions of said silicon body.

5. A method as set forth in claim 4 which further includes implanting P type conductivity determining ions into a predetermined portion of said silicon body to convert it into a P+ type conductivity prior to the formation of said set of buried and said set of surface region in said portion.

6. A method of manufacturing a semiconductor structure having dielectrically isolated monocrystalline silicon regions in a monocrystalline silicon body comprising:
   (a) forming a first set of regions of N type conductivity in said silicon body with adjacent regions separated from each other by P type conductivity regions;
   (b) forming a second set of regions of N type conductivity in said silicon body wherein each region is intermediate and partially overlapping two adjacent regions of said first set of N type regions and wherein adjacent regions in said second set are separated from each other by P type conductivity regions and wherein said regions of said second set are separated from said regions of said first set by a P type silicon body portion of predetermined thickness;
   (c) anodically etching said silicon body to selectively convert said P type conductivity regions between N type regions into porous silicon regions;
   (d) oxidizing said porous silicon regions.

7. A method as set forth in claim 6 wherein said N type regions are formed in a P+ portion of a P type silicon body.

8. A method as set forth in claim 6 wherein said P type conductivity regions between adjacent N type regions of said first set and between adjacent N type regions of said second set and said silicon body portion between N type regions of said first set and said second set are formed to have a higher P type conductivity than said silicon body.

9. A method as set forth in claim 6 wherein said N type regions are formed in a P type portion of a P− type silicon body.

10. A method as set forth in claim 6 wherein:
    (a) said N type regions of said first set are buried regions formed through the implantation of protons in predetermined portions of said silicon body;
    (b) said N type regions of said second set are surface regions formed through the implantation of protons into predetermined portions of said silicon body;
    (c) said body is annealed following the formation of said implanted buried and surface regions referred to in steps (a) and (b) above for the activation of said protons.

11. A method as set forth in claim 10 wherein said structure is annealed at a temperature in the range between 400° to 500° C. for about 30 minutes.

12. A method as set forth in claim 10 which further includes the step of subjecting said oxidized porous silicon to a predetermined temperature level to cause a densification of said oxidized porous silicon regions.

13. A method as set forth in claim 12 wherein said predetermined temperature level is typically greater than 1150° C.

14. A method of manufacturing dielectrically isolated areas of monocrystalline silicon comprising the steps of:
    (a) forming a plurality of N type conductivity buried regions in a P type conductivity monocrystalline silicon body;
    (b) forming a plurality of N type surface regions with predetermined P type conductivity regions between adjacent N type regions wherein said P type regions are spatially disposed over said N type buried regions and separated from said N type buried regions by a portion of said silicon body having a P type conductivity;

(c) anodically etching said silicon body to selectively convert said P type conductivity silicon regions adjoining said N type surface regions into regions of porous silicon; and (d) subjecting said porous silicon regions to oxidation to form silicon oxide regions.

15. A method as set forth in claim 14 wherein the thickness of said P type silicon portion between said plurality of N type buried regions and said plurality of N type surface regions is selected so that following the conversion of said P type silicon regions between said N type regions into silicon dioxide regions said N type surface regions are isolated from the remaining regions of said silicon body by a silicon dioxide layer having a preselected thickness.

* * * * *